United States Patent
Kim et al.

(10) Patent No.: US 9,450,128 B2
(45) Date of Patent: Sep. 20, 2016

(54) MULTI-LAYERED FILM AND PHOTOVOLTAIC MODULES COMPRISING THE SAME

(71) Applicant: LG CHEM, LTD., Seoul (KR)

(72) Inventors: Hyun Cheol Kim, Daejeon (KR); Yoon Kyung Kwon, Daejeon (KR)

(73) Assignee: LG CHEM, LTD., Seoul (KR)

( * ) Notice: Subject to any disclaimer, the term of this patent is extended or adjusted under 35 U.S.C. 154(b) by 543 days.

(21) Appl. No.: 13/950,236

(22) Filed: Jul. 24, 2013

(65) Prior Publication Data

US 2013/0309505 A1     Nov. 21, 2013

Related U.S. Application Data

(63) Continuation of application No. PCT/KR2011/009334, filed on Dec. 2, 2011.

(30) Foreign Application Priority Data

Jan. 27, 2011  (KR) ................ 10-2011-0008328
Dec. 2, 2011   (KR) ................ 10-2011-0128578

(51) Int. Cl.

| B32B 7/12 | (2006.01) |
|---|---|
| B32B 27/06 | (2006.01) |
| B32B 27/30 | (2006.01) |
| H01L 31/049 | (2014.01) |
| H01L 31/048 | (2014.01) |
| C08F 24/00 | (2006.01) |
| C08J 7/04 | (2006.01) |
| B32B 27/32 | (2006.01) |

(52) U.S. Cl.
CPC .......... *H01L 31/0487* (2013.01); *C08F 24/00* (2013.01); *C08J 7/042* (2013.01); *H01L 31/048* (2013.01); *B32B 7/12* (2013.01); *B32B 27/06* (2013.01); *B32B 27/304* (2013.01); *B32B 27/322* (2013.01); *C08J 2300/22* (2013.01); *C08J2367/02* (2013.01); *C08J 2400/104* (2013.01); *C08J 2400/106* (2013.01); *C08J 2427/12* (2013.01); *C08J 2433/14* (2013.01); *C08J 2439/00* (2013.01); *C08L 2203/204* (2013.01); *C08L 2205/02* (2013.01); *C08L 2205/025* (2013.01); *H01L 31/049* (2014.12); *Y02E 10/50* (2013.01); *Y10T 428/265* (2015.01); *Y10T 428/3154* (2015.04); *Y10T 428/31544* (2015.04)

(58) Field of Classification Search
None
See application file for complete search history.

(56) References Cited

U.S. PATENT DOCUMENTS

| 2010/0215902 A1 | 8/2010 | Kiehne et al. |
| 2011/0040021 A1* | 2/2011 | Kaspar ................ B29C 47/0004 524/520 |
| 2011/0108094 A1 | 5/2011 | Nishijima et al. |
| 2011/0226333 A1* | 9/2011 | Abusleme ................ C08L 27/12 136/259 |
| 2012/0031475 A1 | 2/2012 | Kim et al. |
| 2012/0196971 A1* | 8/2012 | Saito ....................... C08L 27/16 524/520 |

FOREIGN PATENT DOCUMENTS

| CN | 101678644 A | 3/2010 |
| JP | 2001-111073 A | 4/2001 |
| JP | 2001-007368 A | 12/2001 |
| JP | 2008-108947 A | 5/2008 |
| JP | 2008-214594 A | 9/2008 |
| JP | 2009246360 A | 10/2009 |
| JP | 2009-267294 A | 11/2009 |
| JP | 2010-287662 A | 12/2010 |
| JP | 2011-071447 A | 4/2011 |
| KR | 10-2009-0094039 A | 9/2009 |
| KR | 10-2010-0012030 A | 2/2010 |
| KR | 10-2011-0048474 A | 5/2011 |
| WO | 2010107282 A2 | 9/2010 |

OTHER PUBLICATIONS

Machine translation of JP 2009-246360A, Oct. 2009.

\* cited by examiner

Primary Examiner — Ramsey Zacharia
(74) Attorney, Agent, or Firm — Dentons US LLP

(57) ABSTRACT

A multi-layered film, a backsheet for photovoltaic modules, a method of manufacturing the same, and a photovoltaic module are provided. The multi-layered film having excellent reliability and adhesive strength under high heat/moisture conditions and also showing excellent weather resistance and durability may be provided by forming a primer layer including an oxazoline group-containing polymer on a substrate and forming a resin layer including a fluorine-based polymer on the primer layer. The primer layer and resin layer of the multi-layered film may be manufactured at a low cost under a low drying temperature using a solvent having a low boiling point, so that the manufacturing costs can be reduced and the quality of the product can be prevented from being deteriorated by thermal deformation or thermal shock. The multi-layered film may be effectively used for a backsheet for photovoltaic modules so that the photovoltaic module can exhibit excellent durability even when exposed to external environments for a long time.

14 Claims, 1 Drawing Sheet

MULTI-LAYERED FILM AND PHOTOVOLTAIC MODULES COMPRISING THE SAME

This application is a Continuation Bypass Application of International Application No. PCT/KR2011/009334, filed Dec. 2, 2011, and claims priority to and the benefit of Korean Patent Application Nos. 10-2011-0008328, filed Jan. 27, 2011, and 10-2011-0128578, filed Dec. 2, 2011, all of which are incorporated herein by reference in their entirety.

BACKGROUND

1. Technical Field

The disclosure relates to a multi-layered film, a backsheet for photovoltaic modules, a method of manufacturing the same, and a photovoltaic module comprising the multi-layered film.

2. Related Art

Recently, much attention has been paid to renewable and clean energy because of global environmental problems and exhaustion of fossil fuels. Among these, solar energy has attracted attention as a representative pollution-free energy source which can solve the problems of environmental contamination and exhaustion of fossil fuels.

A photovoltaic cell to which a principle of photovoltaic power generation is applied is a device configured to convert sunlight into electric energy. Since the photovoltaic cell is exposed to external environments for a long time to facilitate absorption of sunlight, it is manufactured into a unit by performing several packaging processes to protect the cells. The unit is referred to as a photovoltaic module.

Generally, a backsheet having excellent weather resistance and durability is used for the photovoltaic modules to stably protect the photovoltaic cell during long-term exposure to external environments. Such a backsheet generally includes a backsheet in which a resin layer including a fluorine-based polymer such as polyvinyl fluoride (PVF) is stacked on a substrate.

However, the PVF resin has poor adhesion to a polyethylene terephthalate (PET) film typically used as a substrate for the backsheet. Thus, a fluorine-based polymer film obtained by extrusion or casting is laminated on a substrate using a urethane-based adhesive, and used as the substrate. However, this requires the use of expensive film preparing equipment, an adhesive and the application of additional adhesive coating and laminating processes. In addition, a film having a higher thickness than that is required to facilitate handling of the film should be used during the preparation of a film, the use of various additives and fillers are limited, and a high processing temperature is required.

On the other hand, even when a fluorine-based polymer film, which is prepared in the form of a resin suspension or solution, is coated and dried on a substrate, a solvent having a high boiling point is generally used, and thus a high drying temperature of 200° C. or higher is required.

A large amount of energy is used to apply high-temperature heat to a PVF resin solution, which requires a high drying temperature. Accordingly, this increases the production costs of the backsheet for photovoltaic modules and also inflicts thermal shocks on a substrate or causes thermal deformation of the substrate, thereby degrading the quality (e.g., mechanical characteristics, etc.) of the product and rapidly deteriorating the mechanical properties over a long-term outdoor use.

Therefore, there is continuous demand for a material of the backsheet for photovoltaic cells, which has excellent durability and weather resistance and can be dried at a low drying temperature, so that the production costs can be reduced and the productivity and quality of the photovoltaic module can be improved.

SUMMARY

The embodiments of the disclosure are directed to provide a multi-layered film, a backsheet for photovoltaic modules, a method of manufacturing the same, and a photovoltaic module including the multi-layered film.

One aspect of the embodiments provides a multi-layered film including a substrate, a primer layer including an oxazoline group-containing polymer which is formed on the substrate, and a resin layer including a fluorine-based polymer which is formed on the primer layer.

Another aspect of the embodiments provides a method of manufacturing a multi-layered film that includes forming a primer layer including an oxazoline group-containing polymer on a substrate, and forming a resin layer including a fluorine-based polymer on the primer layer.

Still another aspect of the embodiments provides a backsheet for photovoltaic modules including the multi-layered film according to the illustrative embodiments of the present application.

Yet another aspect of the embodiments provides a photovoltaic module including the backsheet for photovoltaic modules according to the illustrative embodiments.

BRIEF DESCRIPTION OF THE DRAWINGS

The above and other objects, features and advantages of the present application will become more apparent to those of ordinary skill in the art by describing in detail the illustrative embodiments thereof with reference to the attached drawings, in which.

DETAILED DESCRIPTION

Figure 1:
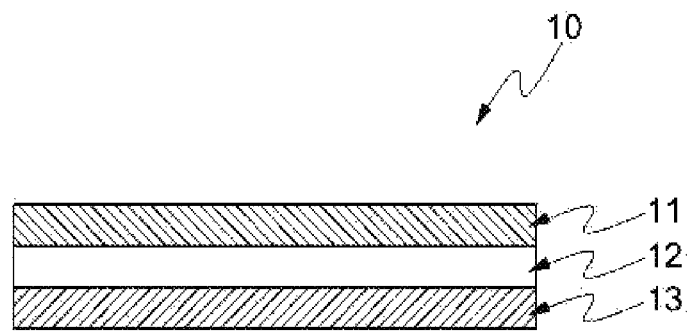
FIG. 1 is a cross-sectional view showing a multi-layered film according to one illustrative embodiment.

Hereinafter, the illustrative embodiments of the present application will be described in detail with reference to the accompanying drawings. In addition, detailed descriptions of related functions or constitutions that are widely known in the art will be omitted in the description. Also, the accompanying drawings are schematically shown in order to help in understanding the illustrative embodiments. Thus, parts that have no relations to clearly explain the illustrative embodiments will be omitted, and the drawings are enlarged in thickness to more clearly illustrate various layers and regions. However, the thickness, size, ratio, and the like as shown in the drawings are intended not to limit the scope of the present application. The present application is not limited to the embodiments disclosed below, but can be implemented in various forms. The following embodiments are described in order to enable those of ordinary skill in the art to embody and practice the present application.

FIG. 1 is a cross-sectional view showing a multi-layered film according to one illustrative embodiment. As shown in FIG. 1, the multi-layered film 10 includes a substrate 13, a primer layer 12 formed on the substrate 13, and a resin layer 11 formed on the primer layer 12. The primer layer 12 includes an oxazoline group-containing polymer, and the resin layer 11 includes a fluorine-based polymer.

Specific kinds of the substrate included in the multi-layered film are not particularly limited, but may include various materials known in the art. Thus, these materials may be properly selected and used according to the desired functions and applications.

According to one illustrative embodiment, a variety of metal films or polymer films may be, for example, used as the substrate. As such, the metal film may include films formed of a general metal component according to applications, and the polymer film may include a single sheet, stacked sheet or co-extruded product such as an acryl film, a polyolefin film, a polyamide film, a polyurethane film or a polyester film. Among these, a polyester film is generally used, but the present application is not particularly limited thereto. Examples of the polyester film include at least one selected from the group consisting of a PET film, a polyethylene naphthalate (PEN) film and a polybutylene terephthalate (PBT) film, but the present application is not particularly limited thereto.

Also, a polyester film having excellent hydrolysis resistance may be used as the polyester film. The polyester film having excellent hydrolysis resistance that may be used herein may include polyester films having a low content of oligomers generated during condensation polymerization. In addition, the polyester film may be given more excellent hydrolysis resistance by further subjecting the polyester film to known heat treatment for improving the hydrolysis resistance so that the content of moisture in the polyester can be lowered and the shrinkage rate can be reduced. A commercially available product may also be used as the polyester film having excellent hydrolysis resistance.

According to the illustrative embodiments, in order to enhance the adhesive strength to a primer layer including an oxazoline group-containing polymer as will be described later, one or both surfaces of the substrate may be subjected to surface treatment such as high-frequency spark discharge treatment such as corona or plasma treatment; thermal treatment; flame treatment; anchoring agent treatment; coupling agent treatment; primer treatment; or chemical activation using a gaseous Lewis acid (for example, $BF_3$), sulfuric acid or hot sodium hydroxide. Surface treatment may be performed using all the general methods known in the art.

According to the illustrative embodiments, the above-described surface treatment may introduce a carboxyl group, an aromatic thiol group and a phenolic hydroxyl group into the surface of the substrate to improve a binding property to an oxazoline group included in the primer layer, thereby further improving the binding affinity between the substrate and the primer layer.

According to the illustrative embodiments, an inorganic oxide-deposited layer may also be formed on one or both surfaces of the substrate to improve the moisture barrier property. Kinds of the inorganic oxide are not particularly limited, but inorganic oxides having a moisture barrier property may be used without limitation. According to the illustrative embodiments, silicon oxide or aluminum oxide may be, for example, used as the inorganic oxide, but the present application is not particularly limited thereto. According to the illustrative embodiments, the method of forming an inorganic oxide-deposited layer on one or both surfaces of a substrate is not particularly limited, but may be achieved using general deposition methods known in the art. According to the illustrative embodiments, when the inorganic oxide-deposited layer is formed on one or both surfaces of the substrate, an inorganic oxide-deposited layer may be formed on the surface of the substrate and the inorganic oxide-deposited layer may then be subjected to the above-described surface treatment.

According to the illustrative embodiments, the thickness of the substrate is not particularly limited, but may be, for example, in the range of 50 μm to 500 μm, or 100 μm to 300 μm. When the thickness of the substrate is controlled to this thickness range, the multi-layered film may show an excellent electric insulation property, moisture barrier property, mechanical property and handling property. According to the illustrative embodiments, however, the thickness of the substrate is not limited to this thickness range, but may be properly adjusted, as necessary.

The multi-layered film according to the illustrative embodiments includes a primer layer formed on the substrate, and the primer layer includes an oxazoline group-containing polymer. When the primer layer includes the oxazoline group-containing polymer, the adhesive strength between the substrate and the resin layer may be improved. That is, the primer layer including the oxazoline group-containing polymer may serve to enhance the adhesive strength to the substrate via the oxazoline group and also improve the binding affinity to the fluorine-based resin layer as will be described later, which leads to a strong binding of the substrate to the resin layer.

According to the illustrative embodiments, kinds of the oxazoline group-containing polymer included in the primer layer are not particularly limited, and the oxazoline group-containing polymers having excellent compatibility with the fluorine-based polymer as will be described later may be used without limitation. According to the illustrative embodiments, a homopolymer of an oxazoline group-containing monomer; a copolymer including an oxazoline group-containing monomer and at least one comonomer; or a mixture thereof may be, for example, used as the oxazoline group-containing polymer, but the present application is not particularly limited thereto.

The oxazoline group-containing monomer that may be used herein may be a compound represented by the following Formula 1.

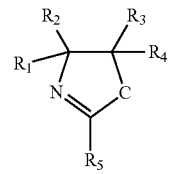

Formula 1

In Formula 1, $R_1$, $R_2$, $R_3$ and $R_4$ each independently represent a hydrogen atom, an alkyl group, a halogen, a substituted or unsubstituted phenyl group, and $R_5$ represents an acyclic hydrocarbon group having an unsubstituted bond.

A substituent for the substituted or unsubstituted phenyl group may include at least one selected from the group consisting of an amino group, a methyl group, a chloromethyl group and a chloro group.

Also, the acyclic hydrocarbon group having the unsubstituted bond may include an alkenyl group, an alkynyl group or an olefin group which may be radically polymerizable with the acyclic hydrocarbon group, but the present application is not particularly limited thereto.

According to the illustrative embodiments, the alkenyl group may be, for example, an alkenyl group having 1 to 12 carbon atoms or 1 to 5 carbon atoms, the alkynyl group may be, for example, an alkynyl group having 1 to 12 carbon atoms or 1 to 5 carbon atoms, and the olefin group may be, for example, an olefin group having 1 to 12 carbon atoms or 1 to 5 carbon atoms, but the present application is not particularly limited thereto.

According to the illustrative embodiments, specific examples of the compound represented by Formula 1 may include at least one selected from the group consisting of 2-vinyl-2-oxazoline, 2-vinyl-4-methyl-2-oxazoline, 2-vinyl-5-methyl-2-oxazoline, 2-isopropenyl-2-oxazoline, 2-isopropenyl-4-methyl-2-oxazoline and 2-isopropenyl-5-ethyl-2-oxazoline, but the present application is not particularly limited thereto.

In the copolymer including the oxazoline group-containing monomer and at least one comonomer according to the illustrative embodiments, the oxazoline group-containing monomer may be included at a content of 1% by weight or more, 5% by weight to 95% by weight, or 10% by weight to 90% by weight, based on the total weight of the copolymer. When the oxazoline group-containing monomer is present at a content of less than 1% by weight in the copolymer including the oxazoline group-containing monomer and at least one comonomer according to the illustrative embodiments, it is difficult to give a sufficient adhesive strength between the substrate and the primer layer.

According to the illustrative embodiments, kinds of the comonomer included in the polymerized form in the copolymer including the oxazoline group-containing monomer and at least one comonomer are not particularly limited, but comonomers which do not react with the oxazoline group but are copolymerizable with the oxazoline group-containing monomer may be used without limitation.

According to the illustrative embodiments, the comonomer may include at least one selected from the group consisting of, for example, an alkyl(meth)acrylate, an amide group-containing monomer, an unsaturated nitrile-based monomer, a vinyl ester-based monomer, a vinyl ether-based monomer, a halogen-containing α,β-unsaturated monomer and an α,β-unsaturated aromatic monomer, but the present application is not particularly limited thereto.

According to the illustrative embodiments, the alkyl(meth)acrylate may contain an alkyl group having 1 to 14 carbon atoms to balance the compatibility with the fluorine-based polymer and give an excellent pressure-sensitive adhesive property. For example, the alkyl(meth)acrylate may include at least one selected from the group consisting of methyl(meth)acrylate, ethyl(meth)acrylate, propyl(meth)acrylate, n-butyl(meth)acrylate, s-butyl(meth)acrylate, t-butyl(meth)acrylate, isobutyl(meth)acrylate, hexyl(meth)acrylate, 2-ethylhexyl(meth)acrylate, n-octyl(meth)acrylate, isooctyl(meth)acrylate, n-nonyl(meth)acrylate, isononyl(meth)acrylate, n-decyl(meth)acrylate, isodecyl(meth)acrylate, n-dodecyl(meth)acrylate, n-tridecyl(meth)acrylate and n-tetradecyl(meth)acrylate.

According to the illustrative embodiments, examples of the amide group-containing monomer may also include (meth)acrylamide, diethylacrylamide, N-vinylpyrrolidone, N,N-dimethyl(meth)acrylamide, N,N-diethyl(meth)acrylamide, N,N'-methylenebisacrylamide, N,N-dimethylaminopropylacrylamide, N,N-dimethylaminopropyl methacrylamide, diacetone(meth)acrylamide or methylol(meth)acrylamide, examples of the unsaturated nitrile monomer may include (meth)acrylonitrile, ethacrylonitrile, phenylacrylonitrile or α-chloroacrylonitrile, examples of the vinyl ester monomer may include vinyl acetate or vinyl propionate, examples of the vinyl ether monomer may include methyl vinyl ether or ethyl vinyl ether, examples of the halogen-containing α,β-unsaturated monomer may include vinyl chloride, vinylidene chloride or unsaturated vinyl, and examples of the α,β-unsaturated aromatic monomer may include styrene or α-methylstyrene, but the present application is not particularly limited thereto.

According to the illustrative embodiments, the oxazoline group-containing polymer may have a weight average molecular weight of 5,000 to 500,000, 10,000 to 250,000, or 20,000 to 150,000, but the present application is not particularly limited thereto. According to the illustrative embodiments, when the weight average molecular weight of the oxazoline group-containing polymer is controlled to this range, the proper compatibility with the fluorine-based polymer and the fluidity may be secured to give the adhesive strength.

A method of polymerizing the oxazoline group-containing polymer that may be used herein is not particularly limited, but the oxazoline group-containing polymer may be polymerized using a known method such as solution polymerization, emulsion polymerization, bulk polymerization or suspension polymerization. Also, the resulting copolymer may be any one of a random copolymer, a block copolymer, an alternating copolymer and a graft copolymer. The variety of methods in preparing an oxazoline group-containing polymer are known in the art, and all these methods are applicable in the present application.

According to the illustrative embodiments, the thickness of the primer layer including the oxazoline group-containing polymer is not particularly limited, but may be, for example, in the range of 10 nm to 10,000 nm, 20 nm to 5,000 nm, or 50 nm to 2,000 nm. When the thickness of the primer layer is less than 10 nm, the adhesive strength may be degraded, whereas the durability and weather resistance of the resin layer including the fluorine-based polymer may be deteriorated when the thickness of the primer layer exceeds 10,000 nm.

The multi-layered film according to the illustrative embodiments is formed on the primer layer, and includes a resin layer including a fluorine-based polymer. Since the resin layer includes a fluorine-based polymer, the fluorine-based polymer may penetrate into the primer layer during the coating process for forming a resin layer, thereby forming an interpenetrating polymer network (IPN), enhancing the adhesive strength and mechanical property in the contact interface through the interaction between a dipole of a C—$F_2$ bond of the fluorine-based polymer and an oxazoline group or an additional functional group, for example an ester group, of the primer layer by means of the van der Waals bond, and improving durability and weather resistance.

According to the illustrative embodiments, kinds of the fluorine-based polymer used to form a resin layer are not particularly limited. For example, the fluorine-based polymer may be a homopolymer, a copolymer or a mixture thereof including at least one monomer selected from the group consisting of vinylidene fluoride (VDF), vinyl fluoride (VF), tetrafluoroethylene (TFE) hexafluoropropylene (HFP), chlorotrifluoroethylene (CTFE), trifluoroethylene, hexafluoroisobutylene, perfluorobutyl ethylene, perfluoro (methylvinylether) (PMVE), perfluoro(ethylvinylether) (PEVE), perfluoro(propylvinylether) (PPVE), perfluoro (hexylvinylether) (PHVE), perfluoro-2,2-dimethyl-1,3-dioxol (PDD) and perfluoro-2-methylene-4-methyl-1,3-dioxolane (PMD) in a polymerized form.

Also, the fluorine-based polymer may be a copolymer including VDF and a comonomer or a copolymer including VF and a comonomer. Kinds of the comonomer which may be included in a copolymerized form in the fluorine-based copolymer are not particularly limited, but may include at least one selected from the group consisting of, for example, TFE, HFP, CTFE, trifluoroethylene, hexafluoroisobutylene, perfluorobutyl ethylene, PMVE, PEVE, PPVE, PHVE, PDD and PMD, but the present application is not particularly limited thereto. As one example, the comonomer may be one of HFP and CTFE.

According to the illustrative embodiments, a content of the comonomer included in the fluorine-based copolymer is not particularly limited, but may be, for example, in the range of 0.5% by weight to 50% by weight, 1% by weight to 40% by weight, 7% by weight to 40% by weight, 10% by weight to 30% by weight, or 10% by weight to 20% by weight, based on the total weight of the fluorine-based copolymer. According to the illustrative embodiments, when the content of the comonomer included in the fluorine-based copolymer is controlled to this content range, the durability and weather resistance of the multi-layered film may be secured and effective interdiffusion and low-temperature drying may be induced.

According to the illustrative embodiments, the fluorine-based polymer may have a weight average molecular weight of 50,000 to 1,000,000, 100,000 to 700,000, or 300,000 to 500,000, but the present application is not particularly limited thereto. According to the illustrative embodiments, the weight average molecular weight is a value converted from that of a polystyrene standard as measured using gel permeation chromatography (GPC). According to the illustrative embodiments, when the weight average molecular weight of the fluorine-based polymer is controlled to this range, excellent solubility and other physical properties may be secured.

According to the illustrative embodiments, the fluorine-based polymer may have a melting point of 80° C. to 175° C., or 120° C. to 165° C. According to the illustrative embodiments, when the melting point of the fluorine-based polymer is controlled to 80° C. or higher, deformation of the multi-layered film may be prevented upon the use of the multi-layered film. When the melting point of the fluorine-based polymer is controlled to 175° C. or lower, it is possible to adjust the solubility in a solvent and improve the gloss of a coated surface.

According to some illustrative embodiments of the present application, the fluorine-based polymer may include i) a first fluorine-based polymer having a melting point of 155° C. or lower or a softening point of 100° C. or lower. Since such a first fluorine-based polymer especially has good miscibility with a polymer containing an oxazoline group, the first fluorine-based polymer may serve to enhance the adhesive strength to the primer layer, thereby further improving the durability of the multi-layered film. Also, the fluorine-based polymer may further include ii) a second fluorine-based polymer having a melting point of 155° C. or higher and a softening point of 100° C. or higher in addition to the first fluorine-based polymer. However, the second fluorine-based polymer may be optionally used, as necessary. Both of the first and second fluorine-based polymers correspond to the above-described fluorine-based polymers, and may be classified according to the melting point and softening point, which are innate characteristics of the material in polymerization of the fluorine-based monomer. The first fluorine-based polymer having a melting point of 155° C. or lower or a softening point of 100° C. or lower may account for 20% by weight or more, preferably 50% by weight or more, in the fluorine-based polymer of the entire resin layer. According to the illustrative embodiments, the melting point or softening point of the fluorine-based polymer may be controlled to facilitate interaction with the oxazoline group-containing polymer of the primer layer.

According to the illustrative embodiments, the thickness of the resin layer is not particularly limited, but may be, for example, in the range of 3 μm to 50 μm, or 10 μm to 30 μm. When the thickness of the resin layer is less than 3 μm, the resin layer is too thin to be filled with a sufficient amount of fillers, which leads to deterioration of the light shielding property. On the other hand, when the thickness of the resin layer exceeds 50 μm, the manufacturing costs may be increased.

The resin layer according to the illustrative embodiments may further include a pigment or filler in addition to the fluorine-based polymer in order to adjust the color or opacity of the resin layer or achieve the other objects. Examples of the pigment or filler that may be used herein may include a metal oxide such as titanium dioxide ($TiO_2$), silica or alumina; a black pigment such as calcium carbonate, barium sulfate or carbon black; or a pigment component expressing other colors, but the present application is not particularly limited thereto. Such a pigment or filler may serve to improve the inherent effects of controlling the color or opacity of the resin layer and also further enhance an adhesive strength of the resin layer due to the presence of an inherent functional group included in each component.

The content of the other additive such as a pigment or filler may be 60% by weight or less, based on the solid content of the fluorine-based polymer and oxazoline group-containing polymer, but the present application is not particularly limited thereto.

Also, the resin layer according to the illustrative embodiments may further include at least one of the general components such as a UV stabilizer, a thermal stabilizer or barrier particles.

According to the illustrative embodiments, the resin layer including the fluorine-based polymer may be a coating layer. The term "coating layer" that may be used herein refers to a resin layer formed using a coating method. More particularly, the term "coating layer" means that a resin layer including the above-described fluorine-based polymer is formed using a method of coating a substrate with a coating solution prepared by dissolving components constituting the resin layer in a solvent, for example, a solvent having a low boiling point, instead of a method of laminating a sheet prepared in a method such as casting or extrusion to a substrate using an adhesive.

FIG. 1 shows that a multi-layered film 10 according to one illustrative embodiment of the present application includes a substrate 13, a primer layer 12 formed on only one surface of the substrate 13, and a resin layer 11 formed on the primer layer 12. Also, a primer layer and a resin layer may be formed on the other surface of the substrate so that the multi-layered film (not shown) according to another illustrative embodiment of the present application can include the primer layer and the resin layer stacked on both surfaces of the substrate.

Also, the multi-layered film according to the illustrative embodiments may further include various functional layers known in the art, as necessary. Examples of the functional layer may include an adhesive layer or an insulation layer. For the multi-layered film according to the illustrative embodiments, for example, the above-described primer layer and resin layer may be sequentially formed on one surface of the substrate, and the adhesive layer and insulation layer may be sequentially formed on the other surface of the substrate. The adhesive layer or insulation layer may be formed using various methods known in the art. For example, the insulation layer may be a layer composed of ethylenevinylacetate (EVA) or low-density linear polyethylene (LDPE). The layer composed of EVA or LDPE may function as an insulation layer, and also function to enhance the adhesive strength to an encapsulant of the photovoltaic module, reduce the manufacturing costs and maintain excellent re-workability as well.

Other illustrative embodiments of the present application are directed to providing a method of manufacturing a multi-layered film including forming a primer layer including an oxazoline group-containing polymer on a substrate, and forming a resin layer including a fluorine-based polymer on the primer layer.

According to the illustrative embodiments, the method of forming a primer layer on a substrate is not particularly limited. For example, a primer layer may be formed based on various methods known in the art by applying a resin composition or coating solution for forming a primer layer on a substrate and drying the resin composition or coating solution under predetermined conditions. Here, the resin composition or coating solution may be prepared by dissolving or dispersing the above-described oxazoline group-containing polymer in a suitable organic solvent such as ethanol or toluene or an aqueous solvent such as water. In this case, the coating method is not particularly limited, but any methods of forming a uniform primer layer, which include known printing methods such as offset printing and gravure printing or known coating methods such as roll coating, knife-edge coating or gravure coating, are applicable. According to the illustrative embodiments, various methods known in the art are applicable in addition to the above-described methods, and the resin composition or coating solution for forming a primer layer may further include other various additives, as necessary.

Specific kinds of the substrate that may be used in the preparation method according to the illustrative embodiments are described above. Before formation of the resin layer, one or both surfaces of the substrate may be subjected to at least one suitable surface treatment selected from the group consisting of deposition, plasma treatment, corona treatment, anchoring agent treatment, coupling agent treatment, primer treatment and thermal treatment, and a substrate whose surfaces are previously surface-treated to form at least one surface-treated layer may be used herein.

According to the illustrative embodiments, at least one surface treatment may be performed on one or both surfaces of the substrate to introduce a carboxyl group, an aromatic thiol group and a phenolic hydroxyl group to a surface of the substrate, as described above. The functional groups may form a chemical covalent bond with the oxazoline group included in the primer layer so that interfacial binding affinity between the substrate and the primer layer may be further improved.

According to the illustrative embodiments, the resin composition for forming a primer layer, that is, a coating solution, may be prepared by dissolving or dispersing the above-described components used to form a primer layer in an aqueous solvent such as water or a solvent having a relatively lower boiling point, more particularly, a solvent having a boiling point of 200° C. or lower. Therefore, the preparation procedure according to the illustrative embodiments does not require a high-temperature drying process, so that the manufacturing costs can be reduced and thermal deformation or thermal shock of the substrate, which may be caused during a high-temperature drying process, can be also prevented, thereby improving the quality of the product.

Examples of the above-described solvent that may be used herein may include at least one selected from the group consisting of water such as distilled water, acetone, methylethylketone (MEK), dimethylformamide (DMF) and dimethylacetamide (DMAC), but the present application is not particularly limited thereto.

The solvent such as water, MEK, DMF or DMAC may be evaporated at a temperature of 200° C. or lower. In this case, the solvent may serve to readily dissolve materials for coating a primer layer including the above-described oxazoline group-containing polymer, and may also be dried at a relatively low temperature after being applied to the substrate together with the materials. In particular, the solvent in the resin composition for forming a primer layer may also serve to swell the surface or the surface-treated layer of the substrate during the coating procedure, so that the oxazoline group-containing polymer included in the primer layer can be interdiffused to the substrate from the contact interface between the substrate and the primer layer coated onto the substrate. The oxazoline group-containing polymer may form a bond with various functional groups, for example, a carboxyl group, an aromatic thiol group or a phenolic hydroxyl group, which are present on the surface of the substrate, via the double bond in the oxazoline group. Thus, since the multi-layered film has the oxazoline group-containing polymer distributed in the substrate adjacent to the primer layer, the adhesive strength between the substrate and the primer layer may be further improved due to the improved physical and chemical binding affinity between the primer layer and the substrate.

According to the illustrative embodiments, the method of preparing a resin composition for forming a primer layer, or a ratio of each component included in the resin composition is not particularly limited, but various methods known in the art may be properly selected and used herein.

According to the illustrative embodiments, after the process of coating the substrate with the resin composition for forming a primer layer, a process of drying the coated resin composition may be further performed. The drying conditions are not particularly limited, but the drying process may be, for example, performed at the temperature of 200° C. or lower or 100° C. to 180° C. for 30 seconds to 30 minutes or 1 minute to 10 minutes. According to the illustrative embodiments, the drying process may be performed under the above-described drying conditions, so that an increase in the manufacturing costs caused by drying at a high temperature of 200° C. or higher can be prevented and the quality of the product can be prevented from being deteriorated by thermal deformation or thermal shock.

Next, the method according to the illustrative embodiments includes forming a resin layer including a fluorine-based polymer on a primer layer so as to prepare a multi-layered film.

According to the illustrative embodiments, the method of forming the resin layer on a primer layer is not particularly limited. For example, a resin layer may be formed based on various methods known in the art by applying a resin composition or coating solution for forming a resin layer on a primer layer and drying the resin composition or coating solution under predetermined conditions. Here, the resin composition or coating solution may be prepared by dissolving or dispersing the above-described fluorine-based polymer in a suitable organic solvent or an aqueous solvent. In this case, the coating method is not particularly limited, but any methods of forming a uniform resin layer, which include known printing methods such as offset printing and gravure printing or known coating methods such as roll coating, knife-edge coating or gravure coating, are applicable. According to the illustrative embodiments, various methods known in the art are applicable in addition to the above-described methods and the resin composition or coating solution for forming a resin layer may further include other various additives, as necessary.

According to the illustrative embodiments, the resin composition for forming a resin layer, that is, a coating solution, may be prepared by dissolving or dispersing the above-described components used to form a resin layer in a solvent having a relatively lower boiling point, more particularly, a solvent having a boiling point of 200° C. or lower. That is, according to the illustrative embodiments, the fluorine-based polymer may be effectively dissolved in the solvent having a relatively lower boiling point. Therefore, the preparation procedure according to the illustrative embodiments does not require a high-temperature drying process, so that the manufacturing costs can be reduced and the thermal deformation or thermal shock of the substrate, which may be caused during a high-temperature drying process, can also be prevented, thereby improving the quality of the product.

Examples of the above-described solvent that may be used herein may include at least one selected from the group consisting of acetone, MEK, DMF and DMAC, but the present application is not particularly limited thereto.

The solvent such as MEK, DMF or DMAC may be evaporated at a temperature of 200° C. or lower. In this case, the solvent may serve to readily dissolve materials for coating a resin layer including the above-described fluorine-based polymer, and may also be dried at a relatively low temperature after being applied to the primer layer together with the materials. In particular, the solvent in the resin composition for forming a resin layer may also serve to swell the surface of the primer layer during the coating procedure, so that the fluorine-based polymer included in the resin layer can be interdiffused to the primer layer from the contact interface between the primer layer and the primer layer. Thus, the adhesive strength between the resin layer and the primer layer may be further improved due to the improved physical and chemical binding affinity between the resin layer and the primer layer.

According to the illustrative embodiments, the resin composition for forming a resin layer may further include various additives such as a pigment, a filler, a UV stabilizer or a thermal stabilizer in addition to the fluorine-based polymer. Each additive may be dissolved in the solvent together with the fluorine-based polymer, or may be prepared in the form of a mill base, regardless of the components, and then mixed with the solvent including the fluorine-based polymer. A chemical interaction such as van der Waals linkage, hydrogen linkage, ionic linkage, or covalent linkage may take place by means of the functional group included in the additive such as a filler or pigment dispersing agent, which may be included in the above-described resin layer. As a result, the adhesive strength between the resin layer and the substrate may be further improved.

According to the illustrative embodiments, the method of preparing a resin composition for forming a primer layer, or a ratio of each component included in the resin composition is not particularly limited, but various methods known in the art may be properly selected and used herein.

According to the illustrative embodiments, after the process of coating the substrate with the resin composition for forming a primer layer, a process of drying the coated resin composition may be further performed. The drying conditions are not particularly limited, but the drying process may be, for example, performed at the temperature of 200° C. or lower or 100° C. to 180° C. for 30 seconds to 30 minutes or 1 minute to 10 minutes. According to the illustrative embodiments, the drying process may be performed under the above-described drying conditions, so that an increase in the manufacturing costs caused by drying at a high temperature of 200° C. or higher can be prevented and the quality of the product can be prevented from being deteriorated by thermal deformation or thermal shock.

Also, the present application is directed to provide a backsheet for photovoltaic modules including the above-described multi-layered film according to the illustrative embodiments.

As described above, the backsheet for photovoltaic modules may include a primer layer formed on the substrate and the primer layer includes an oxazoline group-containing polymer, and a resin layer formed on the primer layer and the resin layer includes a fluorine-based polymer. Here, the oxazoline group included in the primer layer may serve to form a chemical covalent bond with various functional groups present on the surface of the substrate to give an excellent adhesive strength between the substrate and the primer layer, and the fluorine-based polymer included in the resin layer may serve to improve durability and weather resistance and also enhance the interfacial adhesive strength via physical and chemical bonds to the primer layer.

More particularly, during the preparation of the backsheet for photovoltaic modules, the oxazoline group-containing polymer included in the primer layer may be interdiffused to the substrate or a surface-treated layer of the substrate from the interface between the primer layer and the substrate or the interface between the primer layer and the surface-treated layer of the substrate. Thus, a chemical covalent bond may be formed between the substrate and the primer layer, and the adhesive strength may be improved due to chain entanglement and a van der Waals force. Also, the fluorine-based polymer included in the resin layer may be interdiffused to the primer layer from the interface between the resin layer and the primer layer. As a result, the adhesive strength between the resin layer and the primer layer may further be improved due to the chain entanglement and van der Waals force.

Also, the backsheet for photovoltaic modules according to illustrative embodiments of the present application has insulation and moisture barrier properties and also shows durability and weather resistance to stably protect the photovoltaic cells even when exposed to external environments for a long time.

Also, the present application is directed to provide a photovoltaic module including the above-described backsheet for photovoltaic modules according to the illustrative embodiments.

The structure of the photovoltaic module according to the illustrative embodiments is not particularly limited as long as the photovoltaic module includes the multi-layered film as the backsheet for photovoltaic modules. Various structures of the photovoltaic module widely known in the art may be selected and used without limitation.

According to the illustrative embodiments, for example, the photovoltaic module may be configured to include a backsheet, a photovoltaic cell or photovoltaic cell array formed on the backsheet, a light-receiving sheet formed on the photovoltaic cell or photovoltaic cell array, and an encapsulant layer for encapsulating the photovoltaic cell or photovoltaic cell array between the backsheet and the light-receiving sheet.

According to the illustrative embodiments, the above-described multi-layered film according to the illustrative embodiments may be used as the backsheet. Here, the thickness of the backsheet is not particularly limited, but may be, for example, in the range of 30 μm to 2,000 μm, 50 μm to 1,000 μm, or 100 μm to 600 μm. According to the illustrative embodiments, the thickness of the backsheet may be controlled to 30 μm to 2,000 μm, so that the photovoltaic module can be prepared in a thinner type, and the excellent physical properties, such as weather resistance, of the photovoltaic module can be also maintained.

According to the illustrative embodiments, specific kinds of the photovoltaic cell formed on the backsheet are not particularly limited as long as they can serve to cause a photoelectromotive force. Thus, a photovoltaic element that may be generally used in the art may be used for the photovoltaic cell. According to the illustrative embodiments, for example, a crystalline silicon photovoltaic cell made of monocrystalline silicon or polycrystalline silicon, an amorphous silicon photovoltaic cell such as a single binding type or tandem structure type, a Group III-V compound semiconductor photovoltaic cell made of gallium-arsenic (GaAs) or indium-phosphorus (InP), and a Group II-VI compound semiconductor photovoltaic cell made of cadmium-tellurium (CdTe) or copper-indium-selenide ($CuInSe_2$) may be used as the photovoltaic cell. Also, a thin-film polycrystalline silicon photovoltaic cell, a thin-film microcrystalline silicon photovoltaic cell, and a hybrid photovoltaic cell made of thin-film crystalline silicon and amorphous silicon may be used as the photovoltaic cell.

According to the illustrative embodiments, the photovoltaic cell may form a photovoltaic cell array (a photovoltaic cell assembly) by means of a wire used to connect the photovoltaic cells. When sunlight shines on the photovoltaic module according to the illustrative embodiments, electrons (−) and holes (+) are generated in the photovoltaic cell so that an electric current can flow through the wire that connects the photovoltaic cells.

According to the illustrative embodiments, the light-receiving sheet formed on the photovoltaic cell or photovoltaic cell array may serve to protect the inside of the photovoltaic module from wind, rain, external shocks or fire and secure long-term reliability when the photovoltaic module is exposed to outdoor environments. Specific kinds of the light-receiving sheet according to the illustrative embodiments are not particularly limited as long as the light-receiving sheet has excellent light transmission, electric insulation, and mechanical, physical or chemical strength. For example, a glass plate, a fluorine-based resin sheet, a cyclic polyolefin-based resin sheet, a polycarbonate-based resin sheet, a poly(meth)acrylic-based resin sheet, a polyamide-based resin sheet or a polyester-based resin sheet may be used herein. According to one illustrative embodiment of the present application, a glass plate having excellent heat resistance may be used, but the present application is not particularly limited thereto.

The thickness of the light-receiving substrate that may be used herein is not particularly limited, but may be, for example, in the range of 0.5 mm to 10 mm, 1 mm to 8 mm, or 2 mm to 5 mm. According to the illustrative embodiments, the thickness of the light-receiving substrate is controlled to 0.5 mm to 10 mm, so that the photovoltaic modules can be made thinner and can have excellent physical properties such as long-term reliability.

According to the illustrative embodiments, an encapsulant generally known in the art may be also used without limitation for an encapsulant layer to encapsulate the photovoltaic cell or photovoltaic cell array inside of the photovoltaic module, more particularly between the backsheet and the light-receiving sheet.

Figure 2:
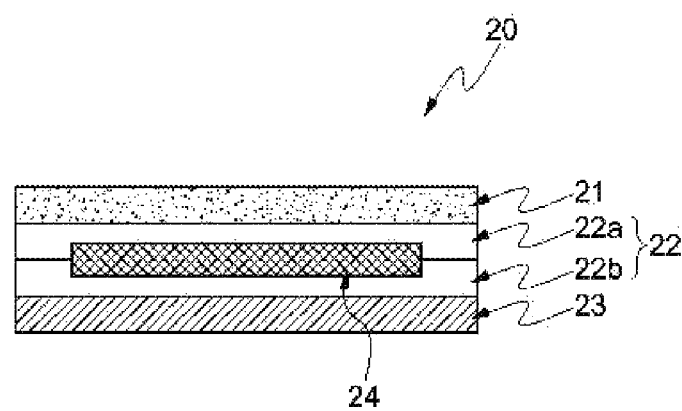
FIG. 2 is a cross-sectional view showing a photovoltaic module according to one illustrative embodiment.
Figure 3:
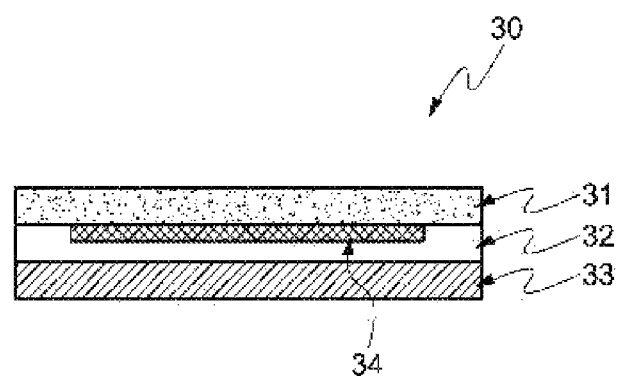
FIG. 3 is a cross-sectional view showing a photovoltaic module according to another illustrative embodiment.

FIGS. 2 and 3 are cross-sectional views showing a photovoltaic module according to various illustrative embodiments of the present application.

FIG. 2 shows one example of a wafer-based photovoltaic module 20 including a backsheet for photovoltaic modules according to the illustrative embodiments. As shown in FIG. 2, the photovoltaic module according to one illustrative embodiment of the present application may generally include a light-receiving sheet 21 made of a ferroelectric material (for example, glass), a backsheet 23 for photovoltaic modules according to the illustrative embodiments, a photovoltaic element 24 such as a silicon-based wafer, and an encapsulant layer 22 for encapsulating the photovoltaic element 24. In this case, the encapsulant layer 22 may include the first layer 22a attached to the light-receiving sheet 21 while encapsulating the photovoltaic element 24, and the second layer 22b attached to the backsheet 23 while encapsulating the photovoltaic element 24. According to the illustrative embodiments, the first and second layers constituting the encapsulant layer 22 may be formed of materials widely known in the art, as previously described above.

FIG. 2 is a cross-sectional view showing a thin-film photovoltaic module 30 according to another illustrative embodiment of the present application. In the case of the thin-film photovoltaic module 30, a photovoltaic element 34 may be generally formed on a light-receiving sheet 31 which may be formed of a ferroelectric material, as shown in FIG. 3. Such a thin-film photovoltaic element 34 may be generally deposited using a method such as chemical vapor deposition (CVD). Like the photovoltaic module 20 as shown in FIG. 2, the photovoltaic module 30 as shown in FIG. 3 includes an encapsulant layer 32 and a backsheet 33, and the encapsulant layer 32 may be formed in a single layer. Detailed description of the encapsulant layer 32 and the backsheet 33 have been described above.

According to the illustrative embodiments, a method of preparing such a photovoltaic module is not particularly limited, but the photovoltaic module may be prepared using various methods known in the art without limitation.

The photovoltaic module as shown in FIGS. 1 and 2 is merely one of the various illustrative embodiments of the photovoltaic module according to the illustrative embodiments. As long as the photovoltaic module includes a backsheet for a photovoltaic module according to the illustrative embodiments, the structure of the photovoltaic module and the kind and size of materials constituting the photovoltaic module are not particularly limited. Thus, photovoltaic modules widely known in the art may be selected and used without limitation.

Hereinafter, the illustrative embodiments of the present application will be described in further detail with reference to Examples. However, the following Examples are described only for illustrative purpose, without departing from the scope of the present application.

Physical properties of each of the films prepared in Examples and Comparative Examples were measured using the following methods.

1. 180° Peel Strength

Peel strength was measured based on the ASTM D1897 standard by cutting a test sample into pieces with a width of 10 mm and peeling the test sample at a peel rate of 4.2 mm/sec and a peel angle of 180°.

2. Cross-Hatch Adhesive Strength

The cross cut test was performed based on a crosscut test standard ASTM D3002/D3359. More specifically, 11 lines were longitudinally and vertically drawn at intervals of 1 mm on a test sample with a knife, respectively, to prepare 100 square lattices each having a width and length of 1 mm. Thereafter, when a CT-24 adhesive tape commercially available from Nichiban Ltd. was attached to the cut surface of the test sample and detached from the cut surface, the state of the surface that was peeled off together with the tape was measured based on the following criteria.

<Evaluation Criteria of Cross-Hatch Adhesive Strength>

5B: There is no peeled surface.

4B: The peeled surface accounts for less than 5% of the entire surface.

3B: The peeled surface accounts for 5 to 15% of the entire surface.

2B: The peeled surface accounts for 15 to 35% of the entire surface.

1B: The peeled surface accounts for 35 and 65% of the entire surface.

0B: The surface is almost entirely peeled off.

3. Pressure Cooker Test (PCT)

The multi-layered films (in which both surfaces of a substrate were coated to form a primer layer and a resin layer) prepared in Examples and Comparative Examples were kept for 25 hours, 50 hours or 75 hours in an oven which was maintained under the conditions of 2 atmospheric pressure, 121° C. and 100% R.H., and the changes in the adhesive strength were then measured.

Preparative Example 1

Preparation of Substrate Layer

The surface of a PET film (thickness: 250 μm, commercially available from Kolon) whose surfaces were not treated was subjected to corona treatment.

Preparation of Fluorine-Based Polymer

Fluorine-based polymers were prepared as will be described in Examples and Comparative Examples of the present application. Monomer components, weight average molecular weights and melting points of the fluorine-based polymers prepared in Examples and Comparative Examples are listed in the following Table 1.

TABLE 1

| Fluorine-based polymers | Monomer ratio (weight ratio) | Weight average molecular weight ($M_w$) | Melting point (° C.) |
|---|---|---|---|
| 1 VDF-CTFE copolymer | 85:15 (VDF:CTFE) | 270,000 | 166 |
| 2 VDF-HFP copolymer | 88:12 (VDF:HFP) | 590,000 | 135 |

VDF: Vinylidene fluoride
CTFE: Chlorotrifluoroethylene
HFP: Hexafluoropropylene

Example 1

Preparation of Coating Solution for Forming Primer Layer 100 g of an aqueous dispersion of an oxazoline group-containing acryl-based polymer (WS-500, commercially available from Nippon Catalyst Co. Ltd.) having a weight average molecular weight of 70,000 was diluted with 100 g of ethanol to prepare a coating solution for forming a primer layer.

Coating and Drying of Primer Layer

The coating solution for forming the primer layer was applied on the previously prepared substrate using a Meyer bar. More particularly, the coating solution was coated on a substrate so that the thickness after drying could be adjusted to approximately 1,000 nm, and the coated substrate was passed through a 120-mesh sieve (a mesh rate of 100%) in an oven with a length of 4 m and a temperature of 120° C. at a rate of 3 m/min to form the primer layer. Thereafter, the other surface of the substrate was coated with the coating solution and dried in the same manner to form the primer layer including the oxazoline group-containing polymer on both surfaces of the PET film (a substrate).

Preparation of Coating Solution for Forming Resin Layer

The first coating solution was prepared by previously dissolving 70 g of fluorine-based polymer 1 (a copolymer including VDF and CTFE in a polymerized form at a weight ratio of 85:15 (VDF:CTFE)) prepared in Preparative Example 1 and 30 g of fluorine-based polymer 2 (a copolymer including VDF and HFP in a polymerized form at a weight ratio of 88:12 (VDF:HFP)) prepared in Preparative Example 1 in 400 g of DMF.

Regardless of the above-described procedure, 0.9 g of a pigment dispersing agent, BYK 111 (commercially available from BYK), and 90 g of a pigment, titanium dioxide (TiPure TS6200, commercially available from DuPont), were also dissolved in 90 g of DMF, and 50 g of zirconia beads having a diameter of 0.3 mm was further added. Then, the resulting mixture was stirred at a rate of 1,000 rpm for 1 hour, and the zirconia beads were then completely removed to prepare 180.9 g of a mill base dispersion.

120.6 g of the prepared mill base dispersion (including 60 g of titanium dioxide) was added to the previously prepared first coating solution, and stirred again to prepare a coating solution for forming the resin layer.

Coating and Drying of Resin Layer

The coating solution for forming the resin layer was applied on the primer layer formed on the prepared PET film using a comma reverse method. More particularly, the coating solution was coated on a substrate at such intervals that the thickness after drying could be adjusted to approximately 20 nm, and the coated substrate was sequentially passed through three ovens, lengths of each of which were 2 m and temperatures of which were set to 80° C., 180° C. and 180° C., at a rate of 1 m/min to form the primer layer. Thereafter, the other surface of the substrate was coated with the coating solution and dried in the same manner to prepare the multi-layered film in which the primer layer and the resin layer were sequentially formed on both surfaces of the PET film (the substrate).

Example 2

A multi-layered film was prepared in the same manner as in Example 1, except that an aqueous dispersion of the oxazoline group-containing acryl-based polymer (WS-700, commercially available from Nippon Catalyst Co. Ltd.) having a weight average molecular weight of 40,000 was used instead of an aqueous dispersion of the oxazoline group-containing acryl-based polymer (WS-500, commercially available from Nippon Catalyst Co. Ltd.) having a weight average molecular weight of 70,000 during the preparation of the coating solution for forming a primer layer.

Example 3

A multi-layered film was prepared in the same manner as in Example 1, except that 40 g of the ceramic pigment (30C965, commercially available from Shepherd) in the form of complex metaloxide was used as a pigment instead of the titanium dioxide (TiPure TS6200, commercially available from DuPont) during the preparation of the mill base dispersion.

Example 4

A multi-layered film was prepared in the same manner as in Example 1, except that an aqueous dispersion of the oxazoline group-containing acryl-based polymer (WS-700, commercially available from Nippon Catalyst Co. Ltd.) having a weight average molecular weight of 40,000 was used instead of an aqueous dispersion of the oxazoline group-containing acryl-based polymer (WS-500, commercially available from Nippon Catalyst Co. Ltd.) having a weight average molecular weight of 70,000 during the preparation of the coating solution for forming the primer layer, and 40 g of a ceramic pigment (30C965, commercially available from Shepherd) in the form of complex metaloxide was used as the pigment instead of the titanium dioxide (TiPure TS6200, commercially available from DuPont) during the preparation of the mill base dispersion.

Example 5

A multi-layered film was prepared in the same manner as in Example 1, except that the pigment, titanium dioxide (TiPure TS6200, commercially available from DuPont), was not used during the preparation of the mill base dispersion.

Example 6

A multi-layered film was prepared in the same manner as in Example 1, except that an aqueous dispersion of the oxazoline group-containing acryl-based polymer (WS-700, commercially available from Nippon Catalyst Co. Ltd.) having a weight average molecular weight of 40,000 was used instead of an aqueous dispersion of the oxazoline group-containing acryl-based polymer (WS-500, commercially available from Nippon Catalyst Co. Ltd.) having a weight average molecular weight of 70,000 during the preparation of the coating solution for forming a primer layer, and the pigment, titanium dioxide (TiPure TS6200, commercially available from DuPont), was not used during the preparation of the mill base dispersion.

Comparative Example 1

A commercially available stacked structure of Tedlar film/adhesive/PET film/adhesive/Tedlar film was used as the multi-layered film. The stacked structure was a product obtained by laminating the Tedlar film (PVF film (thickness: 38 µm), commercially available from DuPont) prepared in the extrusion process of both surfaces of the PET film using an adhesive.

Comparative Example 2

A commercially available stacked structure of Tedlar film/adhesive/PET film/adhesive/Tedlar film was used as the multi-layered film. The stacked structure was a product obtained by laminating the Tedlar film (PVF film (thickness: 25 µm), commercially available from DuPont) prepared in the casting process of both surfaces of the PET film using an adhesive.

Comparative Example 3

A multi-layered film was prepared in the same manner as in Example 1, except that the process of forming the primer layer was omitted.

Comparative Example 4

A multi-layered film was prepared in the same manner as in Example 1, except that the process of forming the primer layer was omitted, and 40 g of a ceramic pigment (30C965, commercially available from Shepherd) in the form of complex metaloxide was used as the pigment instead of the titanium dioxide (TiPure TS6200, commercially available from DuPont) during the preparation of the mill base dispersion.

Comparative Example 5

A multi-layered film was prepared in the same manner as in Example 1, except that the process of forming the primer layer was omitted, and the pigment, titanium dioxide (TiPure TS6200, commercially available from DuPont), was not used during the preparation of the mill base dispersion.

The compositions and contents included in the multi-layered films prepared in Examples and Comparative Examples are listed in the following Table 2.

TABLE 2

| | | Coating solution (Resin composition) | | | |
| --- | --- | --- | --- | --- | --- |
| | | Resin in resin layer | | Pigment | Resin in |
| | | Compositions | Content (g) | Content (g) | primer layer |
| Examples | 1 | Fluorine-based polymer 1 | 70 | TiO$_2$ | WS-500 |
| | | Fluorine-based polymer 2 | 30 | 60 | |
| | 2 | Fluorine-based polymer 1 | 70 | TiO$_2$ | WS-700 |
| | | Fluorine-based polymer 2 | 30 | 60 | |
| | 3 | Fluorine-based polymer 1 | 70 | 30C965 | WS-500 |
| | | Fluorine-based polymer 2 | 30 | 40 | |
| | 4 | Fluorine-based polymer 1 | 70 | 30C965 | WS-700 |
| | | Fluorine-based polymer 2 | 30 | 40 | |
| | 5 | Fluorine-based polymer 1 | 70 | — | WS-500 |
| | | Fluorine-based polymer 2 | 30 | | |
| | 6 | Fluorine-based polymer 1 | 70 | — | WS-700 |
| | | Fluorine-based polymer 2 | 30 | | |
| Comparative Examples | 1 | Tedlar (extrusion)/adhesive/ PET/adhesive/Tedlar (extrusion) | | — | — |
| | 2 | Tedlar (casting)/adhesive/ PET/adhesive/Tedlar (casting) | | — | — |
| | 3 | Fluorine-based polymer 1 | 70 | TiO$_2$ | — |
| | | Fluorine-based polymer 2 | 30 | 60 | |
| | 4 | Fluorine-based polymer 1 | 70 | 30C965 | — |
| | | Fluorine-based polymer 2 | 30 | 60 | |
| | 5 | Fluorine-based polymer 1 | 70 | — | — |
| | | Fluorine-based polymer 2 | 30 | | |

30C965: Ceramic pigment in the form of complex metaloxide (black pigment, commercially available from Shepherd)
WS-500: Oxazoline group-containing acryl-based polymer (commercially available from Nippon Catalyst Co. Ltd.) having a weight average molecular weight of 70,000
WS-700: Oxazoline group-containing acryl-based polymer (commercially available from Nippon Catalyst Co. Ltd.) having a weight average molecular weight of 40,000 A resin of a primer layer in an aqueous dispersion is set to the same content of 100 g.

Experimental Example 1D

The pressure cooker test (PCT) was performed on each of the multi-layered films prepared in Examples 1 to 6 and Comparative Examples 1 to 5, followed by the 180° peel strength and cross-hatch tests. More particularly, each of the multi-layered films was kept under the conditions of 2 atmospheric pressure, 121° C. and 100% R.H. for 25 hours, 50 hours, and 75 hours, and the 180° peel strength and cross-hatch tests were then performed to determine the change in the adhesive strength. The evaluation results are listed in the following Table 3.

TABLE 3

|  |  | 180° Peel strength (N/cm) | | | | Cross-hatch test results | | | |
| --- | --- | --- | --- | --- | --- | --- | --- | --- | --- |
|  |  | Initial | 25 hrs | 50 hrs | 75 hrs | Initial | 25 hrs | 50 hrs | 75 hrs |
| Examples | 1 | Coat-T | Coat-T | Coat-T | Coat-T | 5B | 5B | 5B | 5B |
|  | 2 | Coat-T | Coat-T | Coat-T | Coat-T | 5B | 5B | 5B | 5B |
|  | 3 | Coat-T | Coat-T | Coat-T | Coat-T | 5B | 5B | 5B | 5B |
|  | 4 | Coat-T | Coat-T | Coat-T | Coat-T | 5B | 5B | 5B | 5B |
|  | 5 | 5.6 | 4.9 | 4.0 | 3.0 | 5B | 5B | 5B | 5B |
|  | 6 | 6.0 | 5.3 | 3.6 | Coat-T | 5B | 5B | 5B | 5B |
| Comparative | 1 | PVF-T | PVF-T | PVF-T | 0 | 5B | 5B | 5B | 0B |
| Examples | 2 | 6.7 | 4.4 | 1.4 | 0 | 5B | 5B | 5B | 0B |
|  | 3 | 0 | 0 | 0 | 0 | 0B | 0B | 0B | 0B |
|  | 4 | 0 | 0 | 0 | 0 | 0B | 0B | 0B | 0B |
|  | 5 | 0 | 0 | 0 | 0 | 0B | 0B | 0B | 0B |

Coat-T: Accurate peel strength could not be measured because the resin layer was torn while being peeled.
PVF-T: Accurate peel strength could not be measured because the PVF layer was torn while being peeled.

As listed in Table 3, for the multi-layered films according to the illustrative embodiments of the present application, the resin layer including the fluorine-based polymer exhibited high initial adhesive strength to the substrate (PET) through the primer layer including the oxazoline group-containing acryl-based polymer, and also had an excellent adhesive strength even after the PCT was performed for 75 hours. Even after the PCT was performed for 75 hours, no changes in the appearance such as interface peeling and pinhole generation were also observed in the primer layer and the resin layer. Meanwhile, it was confirmed that the commercially available multi-layered films, Icosolar 2442 and 3469, showed a greatly decreased adhesive strength to the substrate while performing the PCT on the multi-layered films. Also, when the resin layer including the fluorine-based polymer was directly formed on the substrate without forming the primer layer including the oxazoline group-containing polymer (Comparative Examples 3 to 5), the multi-layered films showed poor adhesive reliability, compared to those of Examples according to the illustrative embodiments. In addition, it was seen that the multi-layered films of Examples, which included the primer layer including the oxazoline group-containing polymer, had an excellent adhesive strength, regardless of the presence of a pigment or the kind of pigment.

Comparative Example 6

Preparation of Coating Solution for Forming Primer Layer 400 g of toluene was added as a solvent to a 1 L reactor equipped with a cooling unit to reflux a nitrogen gas and facilitate temperature control, and kept at a temperature of 100° C. Thereafter, a monomer mixture including 16 g of styrene, 76 g of methyl methacrylate, 24 g of butyl acrylate and 84 g of glycidyl methacrylate was prepared and put on one neck of a 3-necked reactor, and an initiator solution obtained by dissolving 10 g of an azo-based initiator (V-65, commercially available from Wako) in 30 g of toluene was prepared and put on another neck of the 3-necked reactor. The initiator solution was slowly dropped for 2 hours, and the monomer mixture started to drop 3 minutes after dropping the initiator solution, and was slowly dropped for a total of 2.5 hours. The reaction was completed after a total of 5 hours of dropping the initiator solution, and an epoxy group-containing acryl-based polymer having a weight average molecular weight of 6,000 was prepared. Thereafter, 100 g of the epoxy group-containing acryl-based polymer was diluted with 400 g of a mixed solvent of toluene and MEK (a weight ratio of 1:1) to prepare the coating solution for forming the primer layer.

Coating and Drying of Primer Layer

The coating solution for forming the primer layer was applied on the substrate previously prepared in Preparative Example 1 using a Meyer bar. More particularly, the coating solution was coated on a substrate so that the thickness after drying could be adjusted to approximately 1,000 nm, and the coated substrate was passed through a 120-mesh sieve (a mesh rate of 100%) in an oven with a length of 4 m and a temperature of 120° C. at a rate of 3 m/min to form the primer layer. Thereafter, the other surface of the substrate was coated with the coating solution and dried in the same manner to form the primer layer including the oxazoline group-containing polymer on both surfaces of the PET film (a substrate).

Preparation of Coating Solution for Forming Resin Layer

The first coating solution was prepared by previously dissolving 70 g of fluorine-based polymer 1 (a copolymer including VDF and CTFE in a polymerized form at a weight ratio of 85:15 (VDF:CTFE)) prepared in Preparative Example 1 and 30 g of fluorine-based polymer 2 (a copolymer including VDF and HFP in a polymerized form at a weight ratio of 88:12 (VDF:HFP)) prepared in Preparative Example 1 in 400 g of DMF.

Regardless of the above-described procedure, 0.9 g of a pigment dispersing agent, BYK 111 (commercially available from BYK), and 60 g of a black pigment, ceramic pigment (30C965, commercially available from Shepherd) in the form of complex metaloxide, were also dissolved in 90 g of DMF, and 50 g of zirconia beads having a diameter of 0.3 mm was further added. Then, the resulting mixture was stirred at a rate of 1,000 rpm for 1 hour, and the zirconia beads were then completely removed to prepare 150.9 g of a mill base dispersion.

100.6 g of the prepared mill base dispersion (including 40 g of 30C965) was added to the previously prepared first coating solution, and stirred again to prepare a coating solution for forming the resin layer.

Coating and Drying of Resin Layer

The coating solution for forming the resin layer was applied on the primer layer formed on the prepared PET film using a comma reverse method. More particularly, the coating solution was coated on a substrate at such intervals that the thickness after drying could be adjusted to approximately 20 nm, and the coated substrate was sequentially passed through three ovens, a length of each of which was 2 m and temperatures of which were set to 80° C., 180° C. and 180° C., at a rate of 1 m/min to form the primer layer. Thereafter, the other surface of the substrate was coated with a coating solution and dried in the same manner to prepare the multi-layered film in which the primer layer and the resin layer were sequentially formed on both surfaces of the PET film (the substrate).

Comparative Example 7

A multi-layered film was prepared in the same manner as in Comparative Example 6, except that the black pigment was not used during the preparation of the mill base dispersion.

Examples 7 to 9

A multi-layered film was prepared in the same manner as in Comparative Example 6, except that a mixed solvent of toluene and ethanol (a weight ratio of 1:1) was used instead of the mixed solvent of toluene and MEK (a weight ratio of 1:1) during the preparation of the coating solution for forming the primer layer, and the coating solution was prepared by mixing the epoxy group-containing acryl-based polymer prepared in Comparative Example 6 and the oxazoline group-containing acryl-based polymer (WS-500, commercially available from Nippon Catalyst Co. Ltd.) at weight ratios as listed in the following Table 4.

Examples 10 to 12

A multi-layered film was prepared in the same manner as in Comparative Example 6, except that a mixed solvent of toluene and ethanol (a weight ratio of 1:1) was used instead of the mixed solvent of toluene and MEK (a weight ratio of 1:1) during the preparation of the coating solution for forming a primer layer, a coating solution was prepared by mixing the epoxy group-containing acryl-based polymer prepared in Comparative Example 6, and the oxazoline group-containing acryl-based polymer (WS-500, commercially available from Nippon Catalyst Co. Ltd.) at weight ratios as listed in the following Table 4, and the black pigment was not used during the preparation of the mill base dispersion.

Example 13

A multi-layered film was prepared in the same manner as in Example 1, except that 100 g of an aqueous dispersion of the oxazoline group-containing acryl-based polymer (WS-500, commercially available from Nippon Catalyst Co. Ltd.) having a weight average molecular weight of 70,000 was diluted with 100 g of distilled water instead of the ethanol during the preparation of the coating solution for forming the primer layer, thereby preparing the coating solution for forming the primer layer.

Example 14

A multi-layered film was prepared in the same manner as in Example 1, except that 100 g of an aqueous dispersion of the oxazoline group-containing acryl-based polymer (WS-500, commercially available from Nippon Catalyst Co. Ltd.) having a weight average molecular weight of 70,000 was diluted with 300 g of distilled water instead of the ethanol during the preparation of the coating solution for forming the primer layer, thereby preparing the coating solution for forming the primer layer.

Example 15

A multi-layered film was prepared in the same manner as in Example 1, except that 100 g of an aqueous dispersion of the oxazoline group-containing acryl-based polymer (WS-500, commercially available from Nippon Catalyst Co. Ltd.) having a weight average molecular weight of 70,000 was diluted with 700 g of distilled water instead of the ethanol during the preparation of the coating solution for forming the primer layer, thereby preparing the coating solution for forming the primer layer.

Example 16

A multi-layered film was prepared in the same manner as in Example 1, except that 100 g of an aqueous dispersion of the oxazoline group-containing acryl-based polymer (WS-500, commercially available from Nippon Catalyst Co. Ltd.) having a weight average molecular weight of 70,000 was diluted with 3,900 g of distilled water instead of the ethanol during the preparation of the coating solution for forming the primer layer, thereby preparing the coating solution for forming the primer layer.

TABLE 4

| | | | Coating solution (Resin composition) | | |
|---|---|---|---|---|---|
| | | | Resin in resin layer | | |
| | | | Compositions | Content (g) | Pigment (Content) | Kinds of resin in primer layer (weight ratio) |
| Comparative Examples | 6 | Same as in Example 1 | Same as in Example 1 | 30C965 (40 g) | Epoxy group-containing acryl polymer |
| | 7 | Same as in Example 1 | Same as in Example 1 | — | Epoxy group-containing acryl polymer |

TABLE 4-continued

| | | Coating solution (Resin composition) | | | |
|---|---|---|---|---|---|
| | | Resin in resin layer | | | |
| | | Compositions | Content (g) | Pigment (Content) | Kinds of resin in primer layer (weight ratio) |
| Examples | 7 | Same as in Example 1 | Same as in Example 1 | 30C965 (40 g) | Epoxy group containing acryl polymer: WS-500 (9:1) |
| | 8 | Same as in Example 1 | Same as in Example 1 | 30C965 (40 g) | Epoxy group containing acryl polymer: WS-500 (7:3) |
| | 9 | Same as in Example 1 | Same as in Example 1 | 30C965 (40 g) | Epoxy group containing acryl polymer: WS-500 (5:5) |
| | 10 | Same as in Example 1 | Same as in Example 1 | — | Epoxy group-containing acryl polymer: WS-500 (9:1) |
| | 11 | Same as in Example 1 | Same as in Example 1 | — | Epoxy group containing acryl polymer: WS-500 (7:3) |
| | 12 | Same as in Example 1 | Same as in Example 1 | — | Epoxy group-containing acryl polymer: WS-500 (5:5) |
| | 13 | Same as in Example 1 | Same as in Example 1 | TiO$_2$ (60 g) | WS-500 |
| | 14 | Same as in Example 1 | Same as in Example 1 | TiO$_2$ (60 g) | WS-500 |
| | 15 | Same as in Example 1 | Same as in Example 1 | TiO$_2$ (60 g) | WS-500 |
| | 16 | Same as in Example 1 | Same as in Example 1 | TiO$_2$ (60 g) | WS-500 |

30C965: Ceramic pigment in the form of complex metaloxide (black pigment, commercially available from Shepherd)
WS-500: Oxazoline group-containing acryl-based polymer (commercially available from Nippon Catalyst Co. Ltd.) having a weight average molecular weight of 70,000 Weight average molecular weight of epoxy group-containing acryl-based polymer: 6,000

Experimental Example 2

The PCT was performed on each of the multi-layered films prepared in Comparative Examples 6 and 7 and Examples 7 to 16, followed by the 180° peel strength and cross-hatch tests. More particularly, each of the multi-layered films was kept under the conditions of 2 atmospheric pressure, 121° C. and 100% R.H. for 25 hours, 50 hours, and 75 hours, and the 180° peel strength and cross-hatch tests were then performed to determine the change in the adhesive strength. The evaluation results are listed in the following Table 5.

TABLE 5

| | | 180° Peel strength (N/cm) | | | | Cross-hatch test results | | | |
|---|---|---|---|---|---|---|---|---|---|
| | | Initial | 25 hrs | 50 hrs | 75 hrs | Initial | 25 hrs | 50 hrs | 75 hrs |
| Comparative Example | 6 | 0 | 0 | 0 | 0 | 4B | 0B | 0B | 0B |
| | 7 | 0 | 0 | 0 | 0 | 0B | 0B | 0B | 0B |
| Example | 7 | Coat-T | Coat-T | 2.5 | 2.2 | 5B | 5B | 5B | 5B |
| | 8 | Coat-T | Coat-T | Coat-T | 3.2 | 5B | 5B | 5B | 5B |
| | 9 | Coat-T | Coat-T | Coat-T | Coat-T | 5B | 5B | 5B | 5B |
| | 10 | 4.9 | 4.6 | 3.2 | 2.2 | 5B | 5B | 5B | 5B |
| | 11 | 4.8 | 4.5 | 3.4 | 3.0 | 5B | 5B | 5B | 5B |
| | 12 | Coat-T | 4.5 | 3.8 | 2.8 | 5B | 5B | 5B | 5B |
| | 13 | Coat-T | Coat-T | Coat-T | Coat-T | 5B | 5B | 5B | 5B |
| | 14 | Coat-T | Coat-T | Coat-T | Coat-T | 5B | 5B | 5B | 5B |
| | 15 | Coat-T | Coat-T | Coat-T | Coat-T | 5B | 5B | 5B | 5B |
| | 16 | Coat-T | Coat-T | Coat-T | Coat-T | 5B | 5B | 5B | 5B |

Coat-T: Accurate peel strength could not be measured because the resin layer was torn while being peeled.

As listed in Table 5, since the primer layer included the oxazoline group-containing acryl-based copolymer in addition to the epoxy group-containing acryl-based polymer, the multi-layered films according to one illustrative embodiment of the present application exhibited high initial adhesive strength to the substrate (PET) regardless of the use of a black pigment, and also had an excellent adhesive strength even after the PCT was performed for 75 hours. Even after the PCT was performed for 75 hours, no changes in the appearance such as interface peeling and pinhole generation were observed in the resin layer. Meanwhile, the multi-layered films of Comparative Examples 6 and 7 in which the primer layer includes only the epoxy group-containing polymer showed poor adhesive reliability, compared to those of Examples according to the illustrative embodiments.

The illustrative embodiments of the present application may provide a multi-layered film having excellent reliability and adhesive strength under high heat/moisture conditions and also showing excellent weather resistance and durability by forming a primer layer including the oxazoline group-containing polymer on a substrate and forming the resin layer including the fluorine-based polymer on the primer layer. Also, the primer layer and resin layer of the multi-layered film according to the illustrative embodiments may be manufactured at a low cost under a low drying temperature using a solvent having a low boiling point, so that the manufacturing costs can be reduced. The multi-layered film may be effectively used for the backsheet for photovoltaic modules so that the photovoltaic module can exhibit excellent durability even when exposed to external environments for a long time.

While the illustrative embodiments of the invention have been shown and described with reference to certain illustrative embodiments thereof, it will be understood by those skilled in the art that various changes in form and details may be made therein without departing from the scope of the invention as defined by the appended claims.

What is claimed is:

1. A multi-layered film comprising:
   a substrate;
   a primer layer formed on the substrate and including an oxazoline group-containing polymer; and
   a resin layer formed on the primer layer and including a first fluorine-based polymer having a melting point of 155° C. or lower and a second fluorine-based polymer having a melting point of 155° C. or higher.

2. The multi-layered film of claim 1, wherein one or both surfaces of the substrate are subjected to at least one treatment before forming the primer layer selected from the group consisting of plasma treatment, corona treatment, primer treatment, anchoring agent treatment, coupling agent treatment and thermal treatment.

3. The multi-layered film of claim 1, wherein the oxazoline group-containing polymer of the primer layer is a homopolymer of an oxazoline group-containing monomer; a copolymer including an oxazoline group-containing monomer and at least one comonomer; or a mixture thereof.

4. The multi-layered film of claim 3, wherein the oxazoline group-containing monomer is a compound represented by the following Formula 1:

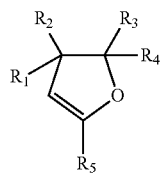

Formula 1 wherein $R_1$, $R_2$, $R_3$ and $R_4$ each independently represent a hydrogen atom, an alkyl group, a halogen, or a substituted or unsubstituted phenyl group, and $R_5$ represents an acyclic hydrocarbon group having an unsubstituted bond.

5. The multi-layered film of claim 3, wherein the oxazoline group-containing monomer is at least one selected from the group consisting of 2-vinyl-2-oxazoline, 2-vinyl-4-methyl-2-oxazoline, 2-vinyl-5-methyl-2-oxazoline, 2-isopropenyl-2-oxazoline, 2-isopropenyl-4-methyl-2-oxazoline and 2-isopropenyl-5-ethyl-2-oxazoline.

6. The multi-layered film of claim 3, wherein a content of the oxazoline group-containing monomer included in the copolymer is 1% by weight or more, based on the total weight of the copolymer including the oxazoline group-containing monomer and at least one comonomer.

7. The multi-layered film of claim 6, wherein a content of the oxazoline group-containing monomer included in the copolymer is in the range of 5% by weight to 95% by weight, based on the total weight of the copolymer including the oxazoline group-containing monomer and at least one comonomer.

8. The multi-layered film of claim 3, wherein the comonomer included in the copolymer is at least one selected from the group consisting of an alkyl(meth)acrylate, an amide group-containing monomer, an unsaturated nitrile-based monomer, a vinyl ester-based monomer, a vinyl ether-based monomer, a halogen-containing α,β-unsaturated monomer and an α,β-unsaturated aromatic monomer.

9. The multi-layered film of claim 1, wherein the oxazoline group-containing polymer has a weight average molecular weight of 5,000 to 500,000.

10. The multi-layered film of claim 1, wherein the primer layer has the thickness of 10 nm to 10,000 nm.

11. The multi-layered film of claim 1, wherein the first fluorine-based polymer and the second fluorine-based polymer are respectively a homopolymer, a copolymer or a mixture thereof including at least one monomer selected from the group consisting of vinylidene fluoride (VDF), vinyl fluoride (VF), tetrafluoroethylene (TFE), hexafluoropropylene (HFP), chlorotrifluoroethylene (CTFE), trifluoroethylene, hexafluoroisobutylene, perfluorobutyl ethylene, perfluoro(methylvinylether) (PMVE), perfluoro(ethylvinylether) (PEVE), perfluoro(propylvinylether) (PPVE), perfluoro(hexylvinylether) (PHVE), perfluoro-2,2-dimethyl-1,3-dioxol (PDD) and perfluoro-2-methylene-4-methyl-1,3-dioxolane (PMD) in a polymerized form.

12. The multi-layered film of claim 1, wherein the first fluorine-based polymer and the second fluorine-based polymer respectively have a weight average molecular weight of 50,000 to 1,000,000.

13. The multi-layered film of claim 1, wherein the resin layer further comprises at least one additive selected from the group consisting of a pigment, a filler, a UV stabilizer, a thermal stabilizer and barrier particles.

14. A backsheet for photovoltaic modules comprising the multi-layered film defined in claim 1.

* * * * *